US005499164A

United States Patent [19]

Hill-Lindsay et al.

[11] Patent Number: 5,499,164
[45] Date of Patent: Mar. 12, 1996

[54] HIGH IMPACT DIGITAL CRASH DATA RECORDER

[75] Inventors: Joseph W. Hill-Lindsay, Dana Point; John T. Yuen, Granada Hills; Alfred R. Blanco, La Habra Heights, all of Calif.

[73] Assignee: Northrop Grumman Corporation, Los Angeles, Calif.

[21] Appl. No.: 264,044

[22] Filed: Jun. 22, 1994

[51] Int. Cl.$^6$ .................................................. H01R 23/68
[52] U.S. Cl. .......................... 361/785; 361/758; 361/770; 361/752; 439/604; 174/151; 174/254
[58] Field of Search ...................... 361/785, 752, 361/758, 767, 770, 796, 804, 816; 439/271, 272, 275, 278, 279, 587, 604, 736; 174/254, 268, 151

[56] References Cited

U.S. PATENT DOCUMENTS

| 3,029,368 | 4/1962 | Wulc | 317/101 |
|---|---|---|---|
| 3,267,334 | 8/1966 | Wulc | 317/101 |
| 3,596,140 | 7/1971 | Walsh | 317/101 DH |
| 3,597,659 | 8/1971 | Hoffman | 317/101 D |
| 4,254,446 | 3/1981 | Peoples | 361/383 |
| 4,574,331 | 3/1986 | Smolley | 361/393 |
| 4,581,679 | 4/1986 | Smolley | 361/395 |
| 4,734,825 | 3/1988 | Peterson | 361/414 |
| 4,833,568 | 5/1989 | Berhold | 361/383 |
| 5,013,249 | 5/1991 | Lindeman et al. | 439/66 |
| 5,247,424 | 9/1993 | Harris et al. | 361/704 |

*Primary Examiner*—Leo P. Picard
*Assistant Examiner*—Y. Whang
*Attorney, Agent, or Firm*—Terry J. Anderson; Karl J. Hoch, Jr.

[57] ABSTRACT

A high impact high memory capacity flight data recorder, includes a plurality of planar parallel circuit cards and a plurality of planar parallel spacers stacked in alternating sequence to form a card stack. Each of the circuit cards includes a circuit board, plural integrated circuits mounted on the circuit board, plural connector pads on a periphery of the circuit board connected through the circuit board to output terminals of the integrated circuit memories, a foam layer covering the plural integrated circuit memories and an adjacent portion of the circuit board, the periphery of the circuit board being uncovered by the foam layer. Each of the spacers includes a spacer body coextensive with the periphery of the circuit board and surrounding a void into which the foam layer nests, a lip surrounding the annulus and surrounding a void above the annulus, the annular periphery of the circuit board nesting in the void above the spacer body and plural connector tunnels in registration with the plural connector pads and a button connector in each connector tunnel squeezed between connector pads of adjacent circuit boards. A rigid housing surrounds the plural circuit cards and plural spacers.

20 Claims, 6 Drawing Sheets

HIGH IMPACT DIGITAL CRASH DATA RECORDER

GOVERNMENT LICENSE RIGHTS

The U.S. Government has a paid-up license in this invention and the right in limited circumstances to require the patent owner to license others on reasonable terms as provided for by the terms of contract DAAH∅1-91-C-A∅17 awarded by the United States Army.

BACKGROUND OF THE INVENTION

1. Technical Field

The present invention is related to flight data recorders and in particular to flight data recorders able to withstand high-g impact while having a very high data storage capacity.

2. Background Art

On-board flight data recorders, such as the "black box" crash data recorder of a commercial airliner, a typically unable to withstand impact loads significantly greater than 3,400 G's (where a G is the force exerted on a body by accelerating it at 32 feet/sec/sec). Moreover, such flight recorders have relatively low storage capacity, their purpose being to store only the last several minutes of on-board instrumentation data of a flight before a crash.

In attempting to construct a flight data recorder that can withstand extremely high impact forces (e.g., 40,000 G's), the problem is that a tape memory is relatively bulky while a semiconductor chip memory is subject to resonance shattering from high frequency high impact forces or is subject to breakage from low frequency bending of the circuit package.

An object of the present invention is to provide a sufficiently rigid support for semiconductor memory chips to protect them from bending while at the same time filtering out high frequencies which would shatter the chip. The goals of filtering out high frequency while increasing rigidity would seem to be incompatible, but both are fulfilled in the present invention. Moreover, the present invention meets the goal of extremely high memory storage capacity (e.g., 20 Megabytes).

SUMMARY OF THE INVENTION

A high impact high memory capacity crash data recorder, includes a plurality of planar parallel memory cards and a plurality of planar parallel spacers stacked in alternating sequence to form a card stack. Each of the memory cards includes a circuit board, plural integrated circuits mounted on the circuit board, plural connector pads on a periphery of the circuit board connected through the circuit board to output terminals of the integrated circuit memories, a foam layer covering the plural integrated circuit memories and an adjacent portion of the circuit board, the periphery of the circuit board being uncovered by the foam layer. Each of the spacers includes a spacer body coextensive with the periphery of the circuit board and surrounding a void into which the foam layer nests, a lip surrounding the annulus and surrounding a void above the annulus, the annular periphery of the circuit board nesting in the void above the spacer body and plural connector tunnels in registration with the plural connector pads and a button connector in each connector tunnel squeezed between connector pads of adjacent circuit boards. A rigid canister housing surrounds the plural memory cards and plural spacers.

Preferably, the circuit board is disk-shaped, the periphery is a circular annulus, each spacer is a disk-shaped annulus, and the rigid housing is cylindrically-shaped and has an interior diameter no greater than the outside diameter of the lip. Axial ribs extend outwardly from the exterior surface of the lip and abut the interior surface of the housing.

Preferably, each circuit board has two opposing planar surfaces, and there are plural integrated circuit memories and connection pads on both of the planar surfaces and a lip on both opposing faces of each spacer body. Conductor paths inside the periphery connect together connection pads on opposite sides of the periphery to provide a common bus connection for all of the memory cards.

Plural stand-off clearance holes extend through the memory cards and through the spacers, the clearance holes through the memory cards being in registration with the clearance holes through the spacers, and rigid stand-off rods are inserted through the clearance holes, each rod passing through all of the memory cards and spacers. Screws in the card stack end caps thread into each end of the rigid stand-offs.

Preferably, the bodies of spacers between successive memory cards have a thickness substantially equal to half that of the circuit board of each memory card, and the lips of spacers between successive memory cards have an axial thickness substantially equal to twice that of the foam layer on each side of each memory card. A half spacer at each end of the card stack has a half spacer body coextensive with the periphery and surrounding a void into which the foam layer of an outer side of end one of the memory cards nests, the half spacer body having a thickness equal to that of the foam layer. Conical end caps having flat sides cover each of the half spacers.

Isolation pads lie between the conical end caps and the adjacent interior surfaces of the canister housing, the isolation pads are wadded packing tissue in one implementation.

Preferably, the spacers are integrally formed of foam. The foam layer and the foam of the spacers comprises rigid polyurethane foam.

In a preferred implementation, the plural integrated circuits mounted on an end one of the circuit cards in the stack are I/O circuits, there is a ribbon cable opening through the canister housing and a ribbon cable connected to the end one of the memory cards extends through the ribbon cable opening through the canister housing. The one circuit card at the other end of the stack has a processor integrated circuit thereon, the processor integrated circuit being programmed to control storage of data received via the ribbon cable to respective memory locations in other ones of the circuit cards. The integrated circuits on the other ones of the circuit cards are EEPROM integrated circuits.

Preferably, the button connectors are cylindrically bundled highly-conductive thin wire bundles.

In the preferred embodiment, a cut-out region in the foam layer exposes a portion of the circuit board, there being plural connection pads on the portion of the circuit board exposed by the cut-out region. A peninsula extends radially inwardly from an inner circumference of the spacer body and is coextensive with the cut-out region, there being plural button connector tunnels therein in registration with a preselected pattern of the plural connection pads on the exposed portion of the circuit board. This pattern is different in each different one of the spacers. Specifically, the pattern determines a unique electronic address for each one of the memory cards. The cut-out region provides rotational alignment between the spacers and the memory cards.

DETAILED DESCRIPTION OF THE PREFERRED EMBODIMENT

Figure 1:
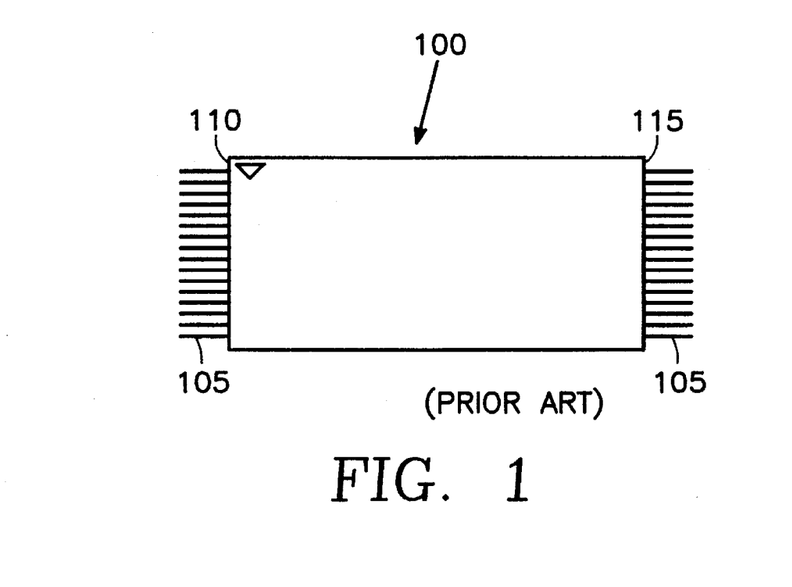
FIGS. 1 and 2 are top and side views, respectively of a Thin Small-Outline Package (TSOP) of an integrated circuit of the prior art employed in the preferred embodiment of the invention.
Figure 2:
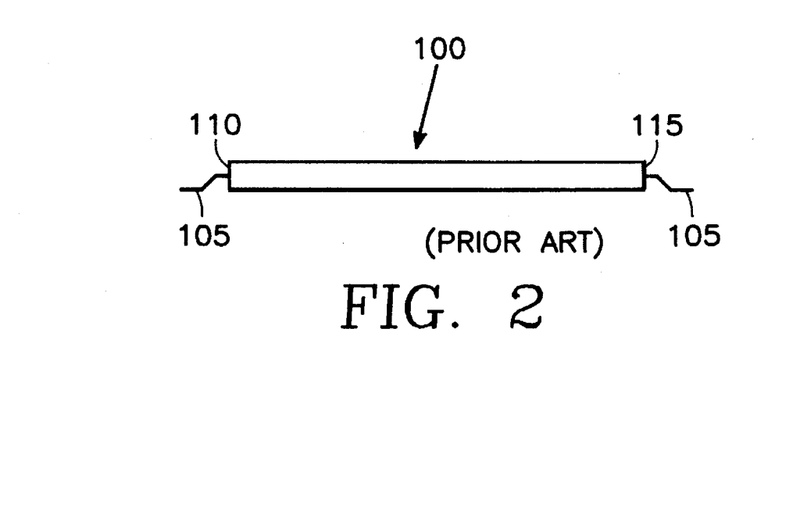

A preferred embodiment of the invention employs commercial flash electrically erasable programmable read-only memories (EEPROM's) packaged in Thin Small-Outline Packages (TSOP's). One commercially available package is the Intel F28F020-150 T11001P7 EEPROM TSOP sold by Intel Corporation of Santa Clara, Calif. having 256 k-bytes of memory, and is illustrated in FIGS. 1 and 2. It consists of the plastic housing 100 having a rectangular aspect (FIG. 1) and a thin cross-section (FIG. 2). Sixteen external connection pins 105 extend out from each of the two ends 110, 115 of the housing 100.

Figure 3:
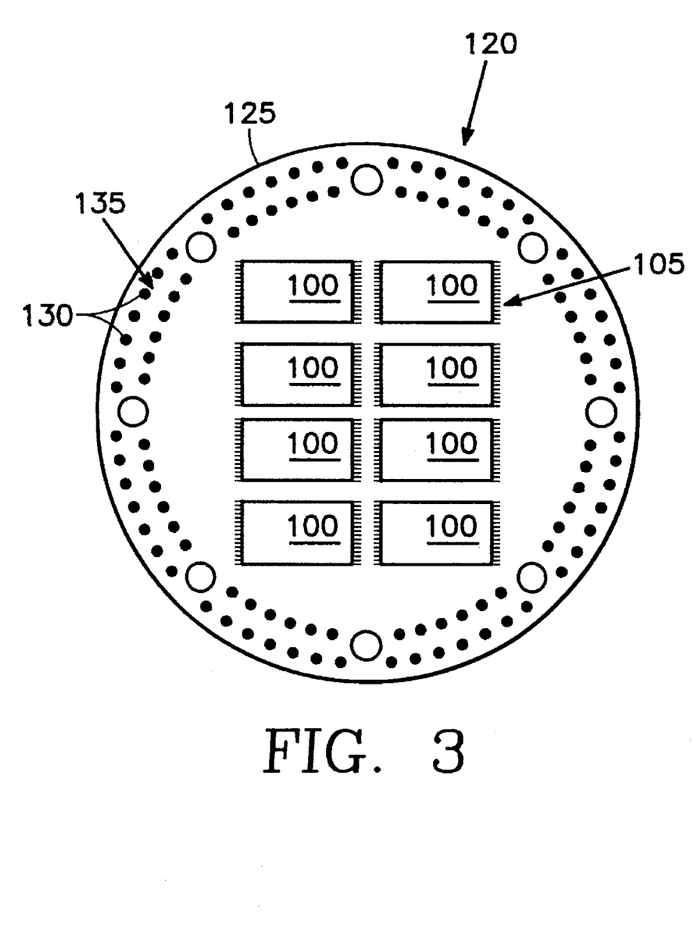
FIG. 3 is a top view of a circuit card of the invention.

Referring to FIG. 3, a 4-megabyte memory card 120 consists of a disk-shaped circuit board 125 with internal metal connection layers (FIG. 5) of the type well-known in the art. Eight EEPROM TSOP's 100 are mounted on each face of the circuit board 125 in the manner illustrated in FIG. 3. Individual bonding pads on the face of the circuit board 125 are used to bond individual pins 105 of each EEPROM TSOP 100 in a manner well-known in the art. Those bonding pads are connected to individual connection pads 130 via the internal connection layers inside the circuit board 125 shown in cross section in FIG. 5. All of the connection pads 130 lie along the circumferential periphery 135 of the circuit board 125.

Figure 4:
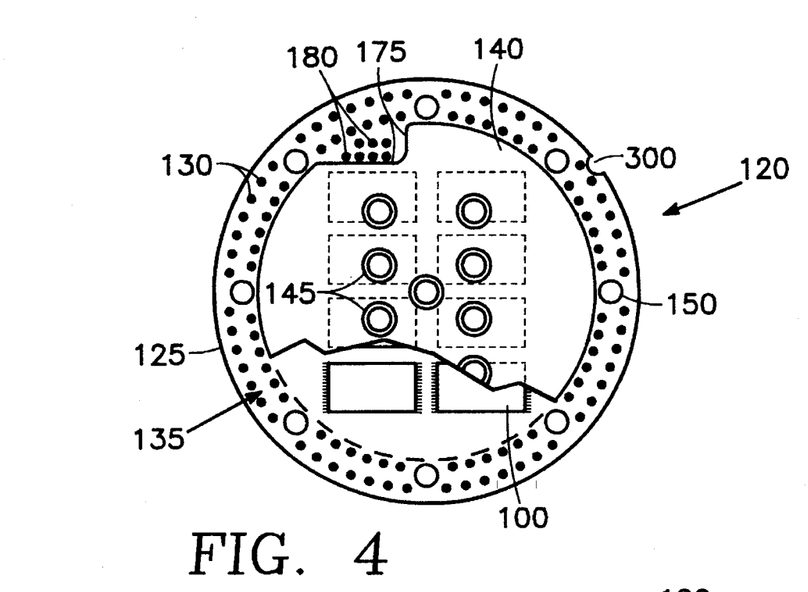
FIG. 4 is a top view of the circuit card of FIG. 3 covered with a foam layer.
Figure 5:
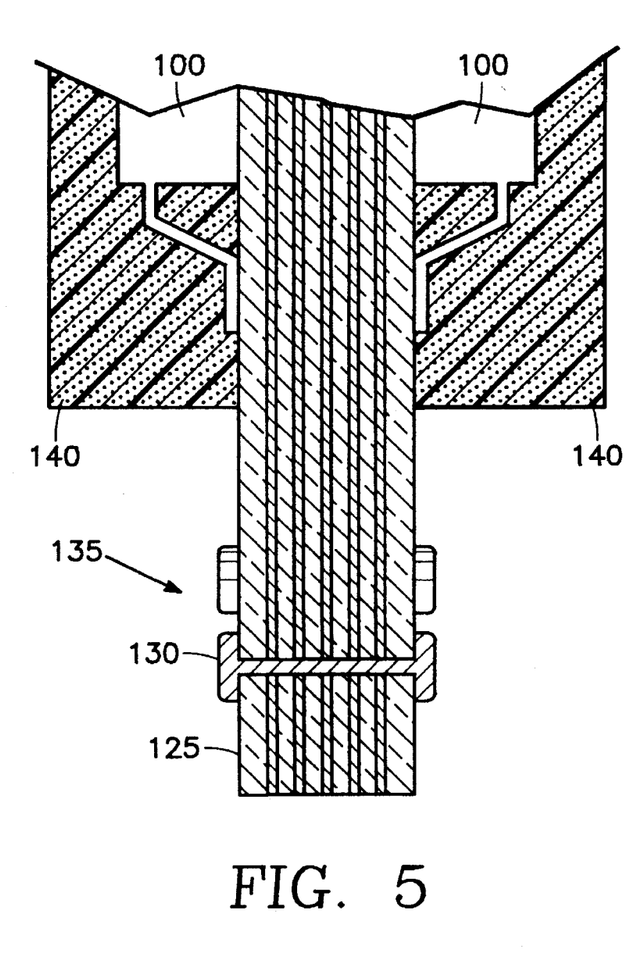
FIG. 5 is a side view corresponding to FIG. 4.
Figure 6:
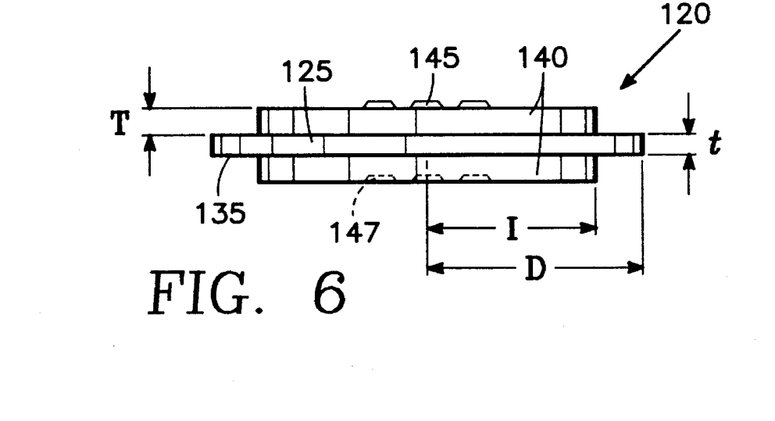
FIG. 6 is an enlarged cross-sectional view corresponding to FIG. 5.

The major portion of the circuit board 125 surrounded by the periphery 135 is encapsulated in a disk-shaped 20 PCF polyurethane foam layer 140 as shown in FIGS. 4, 5 and 6, of sufficient thickness T to cover all of the EEPROM TSOPs 100 while leaving the periphery 135 and connection pads 130 exposed. The foam 140 advantageously fills all voids, including the small gaps between each EEPROM TSOP 100 and the underlying surface of the circuit board 125. On the top side of the memory card 120, the foam layer 140 is molded with alignment nubs 145 in a particular pattern (e.g., an "H" pattern in the preferred embodiment of FIGS. 4-6) while on the bottom side of the memory card 120, the foam layer 140 is molded with alignment detents 147 in the same pattern and matching the alignment nubs 145 on the top side. The periphery 135 of the circuit board 125 includes standoff holes 150 which, in the preferred embodiment, constitute eight regularly spaced holes.

Figures 7A, 7B, 8:
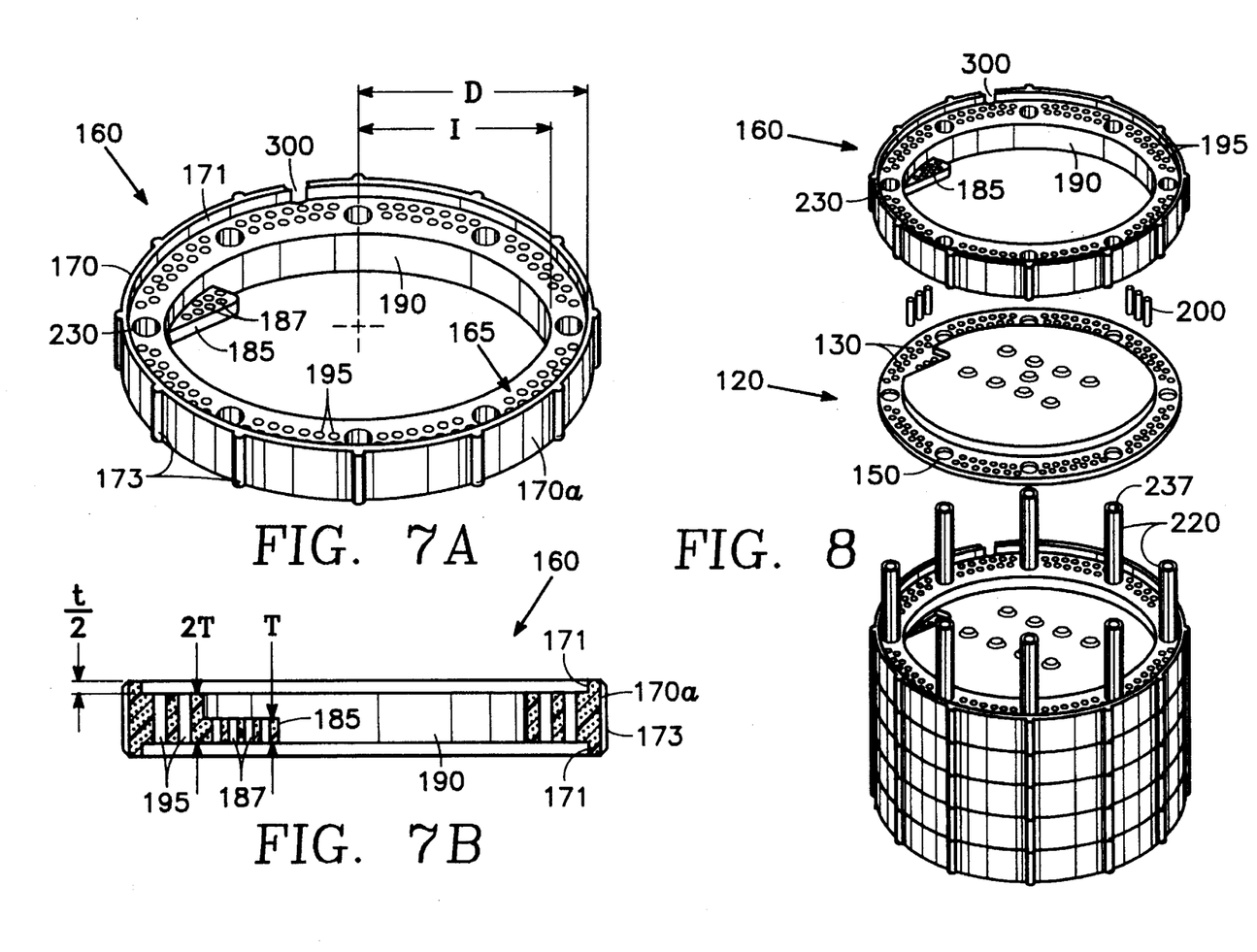
FIGS. 7A and 7B are perspective and side cross-sectional views, respectively, of an annular spacer of the invention.
FIGS. 8 is a perspective view of a partially disassembled stack of spacers and memory cards in accordance with the invention.

FIGS. 7A and 7B illustrate an annular spacer 160 for stacking the memory card 120 of FIG. 4. The spacer 160 is integrally formed of 15 PCF polyurethane foam and includes an annular ring 165 with inside and outside diameters I and D matching that of the periphery 135 of the circuit board 125 and an axial thickness equal to twice the thickness T of the foam layer 140 on a given side of the circuit board 125, as indicated in FIG. 6. The spacer 160 further includes an external annulus 170 forming a lip 171 above the annular ring 165 having a height equal to half the thickness t of the circuit board 125, as indicated in FIGS. 6 and 7B. The outer circumferential surface 170a of the external annulus 170 has plural regularly-spaced axial ridges 173. As shown in FIG. 4, the disk-shaped foam layer 140 has a nearly triangular-shaped cut-out 175 exposing seven connection pads 180 on the underlying circuit board 125, while the spacer 160 of FIG. 7 has a nearly triangular-shaped peninsula 185 of thickness T extending inwardly from its inner circumferential surface 190 and matching the cut-out 175 in the foam layer 140 of the memory card 120. The peninsula 185 has connector holes 187 therein matching the connector pads 180 in the cut-out 175. When the memory card 120 is stacked onto the spacer 160, the peninsula 185 nests in the cut-out 175, thereby providing a fixed rotational alignment between the memory card 120 and the spacer 160. The annular ring 160 includes plural connector tunnels 195 in registration with the plural connector pads 130 on the periphery 135 of the memory card 120.

Figure 9:
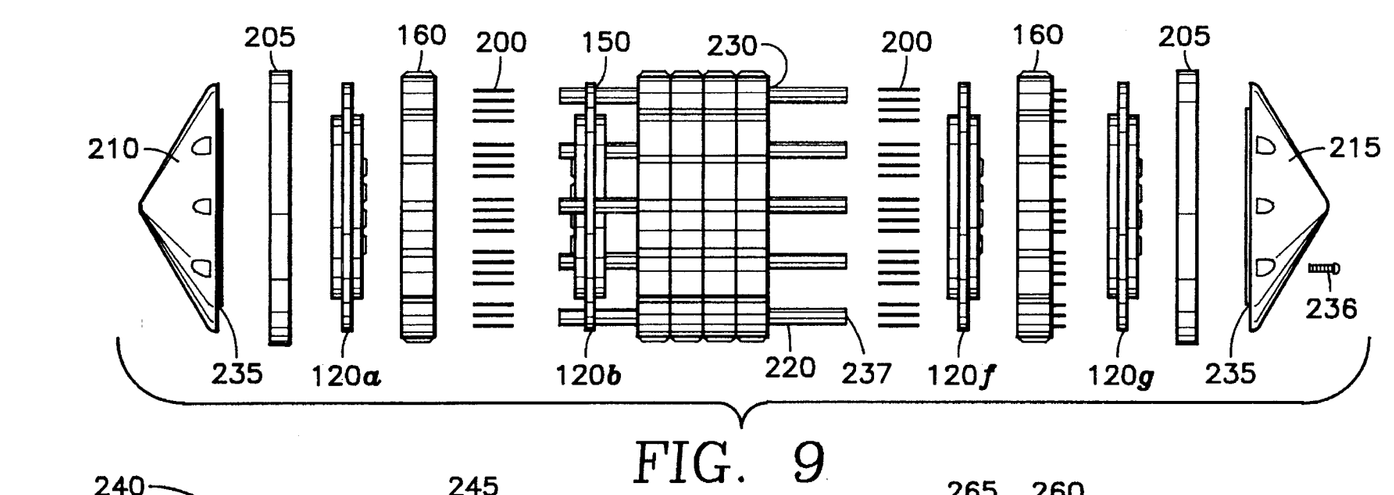
FIG. 9 is a side exploded view of the stack of FIG. 8.

Plural memory cards 120 and spacers 160 may be stacked in alternating sequence, as illustrated in FIGS. 8 and 9. A connector button 200 is inserted into each connector tunnel 195 and connection hole 187 in the spacer 160. Each connector button 200 is slightly compressed within its tunnel 195 between the facing connection pads 130 of adjacent memory cards 120. In the embodiment of FIGS. 8 and 9, there are 104 tunnels 195 and 104 connector buttons 200 on each side of a given memory card 120. The connector buttons 200 are preferably so-called fuzz button connectors of the type well-known in the art consisting of 0.002 inch gold-plated beryllium copper wire wadded in a cylindrical shape. In order to provide a common bus for all memory cards 120 in the stack, the connection pads 130 on opposite sides of the circuit board periphery 135 are commonly connected through the interior of the circuit board periphery 135, as indicated in the partially cut-away cross-sectional view of FIG. 5. Referring to FIG. 9, seven cards 120 are stacked together in alternating sequence with six spacers 160. The stack is terminated at each end by half spacers 205. Each half-spacer 205 is a 15 PCF polyurethane foam annulus having an inner and outer diameter matching that of the circuit board periphery 135 and having an axial thickness equal to the thickness T of the foam layer 140 on each card 120. The entire stack is held between conical end caps 210, 215 filled with 35 PCF polyurethane foam. Eight long cylindrical steel stand-offs 220 are inserted through periodically spaced matching stand-off bores 150 through the circuit board periphery 135 of each card 120, matching stand-off bores 230 through each annular spacer 160 and matching bores 235 in the end caps 210, 215. The end caps 210, 215 are fastened to respective ends of the stand-offs 220 by screws 236 threaded into tapped holes 237 at each end of each stand-off 220. In this manner, the end caps 210, 215 hold the stack together.

Figure 10:
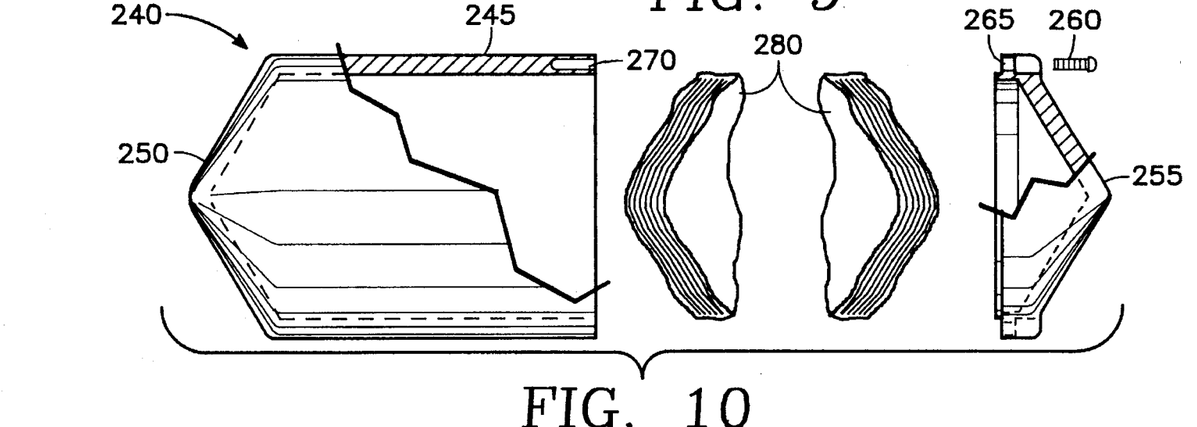
FIG. 10 is a cross-sectional side view illustrating the canister of the invention.

The stack of FIG. 9 is firmly compressed together and protectively housed within a titanium canister 240 having a cylindrical body 245 integrally formed with a conical end 250 on one end, the other end thereof fastened to a matching titanium conical end cap 255. The titanium conical end 250 and the titanium conical end cap 255 match the conical shape or angle of the end caps 210, 215. This angle is 120 degrees in the preferred embodiment. The inside diameter of the titanium cylindrical body 245 is equal to or just slightly less than the outside diameter of each of the spacers 160 measured at the axial ribs 173. As the stack of memory cards 120 and spacers 160 is inserted into the canister cylindrical body 245, the outer skin of each rib 173 is shorn at the sharp corner edge of the canister body 245. The advantage is that the spacers are firmly self-centered within the canister 240 with no opportunity for radial vibration or displacement therebetween. The titanium end cap 255 is fastened to the titanium body 245 by screws 260 inserted through axial holes 265 in the end cap 255 and threaded into internally threaded holes 270 in the body 245. Axial isolation pads 280, constituting packing tissue for example, are inserted into the interior of the titanium end cap 255 and the interior of the conical end 250, to be crushed against the foam end caps 210, 215 as the titanium canister screws 260 are tightened into the screw holes 270, as shown in FIGS. 10 and 11.

Figure 11:
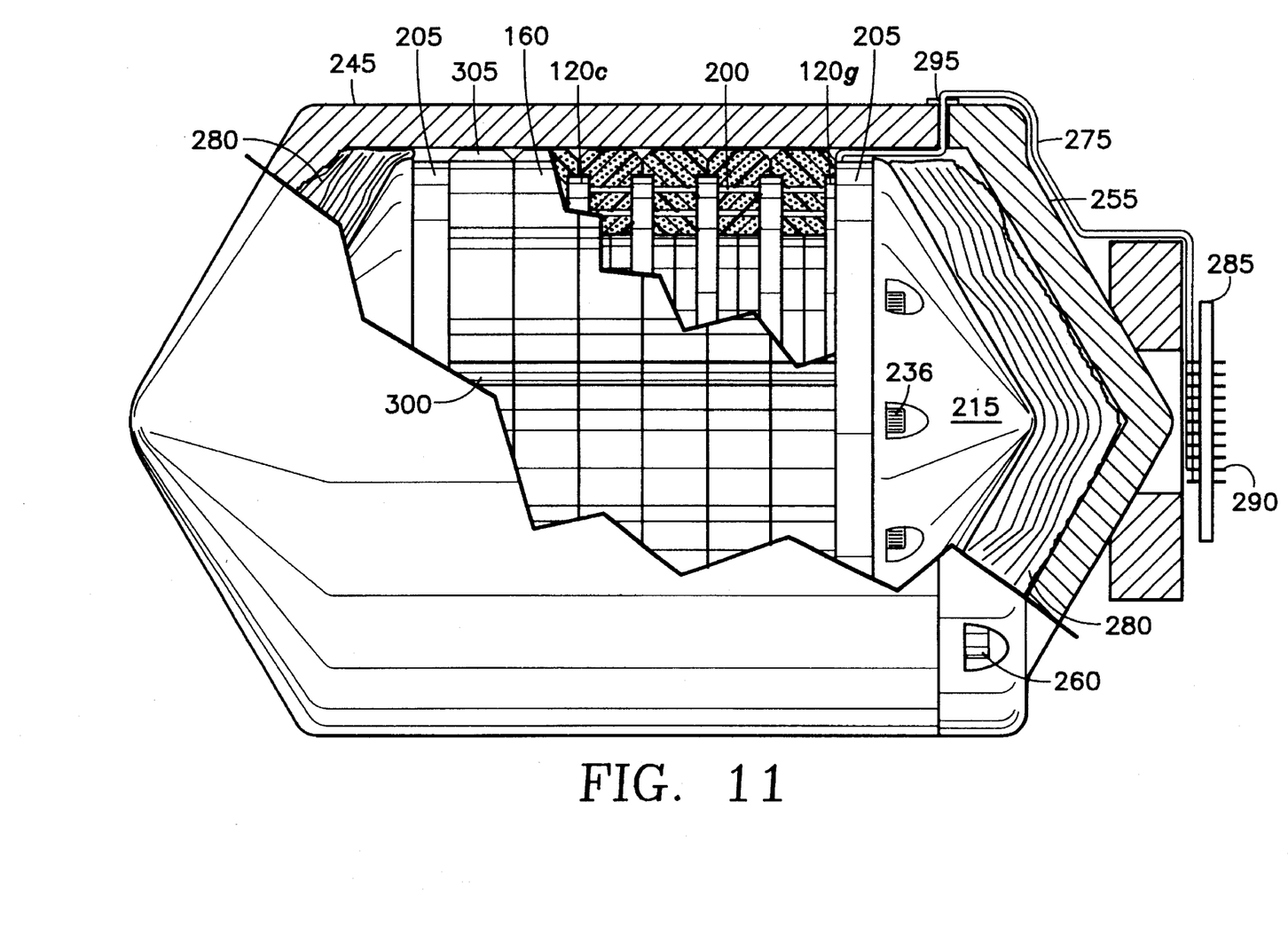
FIG. 11 is a partially cut-away cross-sectional side view of the assembled crash data recorder of the preferred embodiment.

As shown in FIG. 11, the card 120g nearest the titanium end cap 255 has a 32-wire ribbon cable 275 which exits through a port 295 between the titanium end cap 255 and the titanium body 245 for receiving data to be stored in memory during flight. The external end of the ribbon cable 275 terminates in an interface header 285 including header pins 290.

In order to rotationally align the stack of memory cards 120 and spacers 160 with the titanium canister 240, each memory card 120 and each spacer 160 has an alignment detent 300 which is in registration with all other alignment detents 300.

Figure 12:
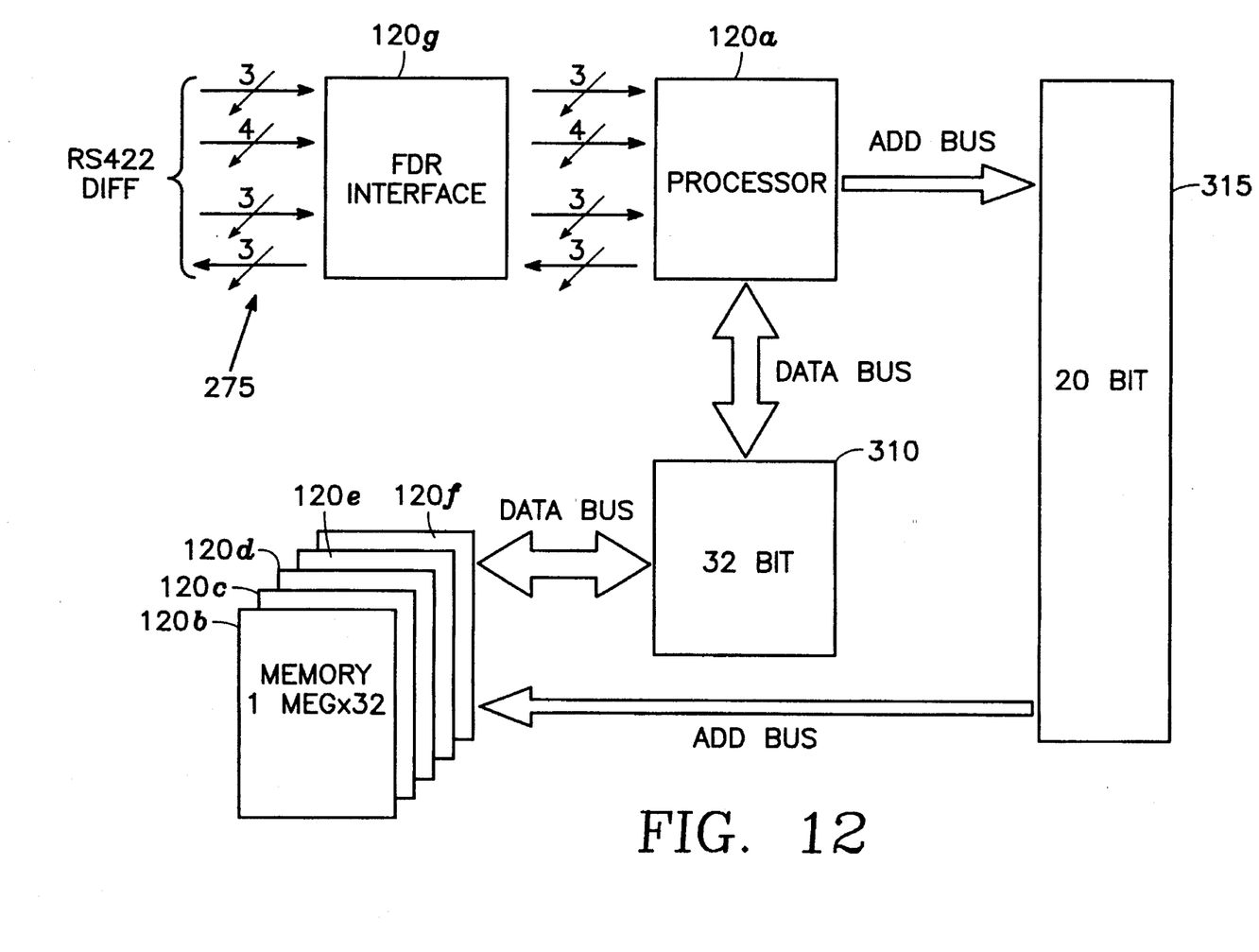
FIG. 12 is a simplified schematic diagram of the memory architecture of the crash data recorder of FIG. 11.

In the preferred embodiment, only five of the seven cards (namely, those cards labelled 120b–120f) are actually memory cards of the type described in detail with reference to FIG. 3. The card 120g nearest the titanium end cap 255 is an I/O circuit board while the card 120a at the opposite end of the stack is a processor circuit board. The processor circuit board manages the recording in various ones of the memory cards 120b–120f of data received via the ribbon cable 275, while the I/O circuit board card 120g provides an interface between the processor circuit board card 120a and the incoming data signals. The preferred system architecture is illustrated in FIG. 12. The ribbon cable 275 provides an RS422 data port to the I/O card 120g. The processor card 120a communicates with the memory cards 120b–120f via a data bus 310 and an address bus 315. It will be remembered that common bus connections among all the cards 120 is provided by the connection pads 130 and the fuzz button connectors 200, some of the connection pads 130 providing through-connection between opposite sides of the cards 120. Of these, 32 bits are dedicated to the data bus 310 while 20 bits are dedicated to the address bus 315.

Each EEPROM chip 100 has a storage capacity of 256 K-bytes, and there are sixteen chips 100 on each one of the five memory cards 120 (eight chips on each side, as illustrated in FIG. 3), so that each memory card 120b–120f stores about four megabytes and the entire system stores 20 megabytes.

Standard data processing techniques are employed in the preferred system of FIG. 12. Specifically, the I/O circuit board card 120g has circuits of the type which convert synchronous single ended TTL interface signals to differential RS422 signals and vice versa. There are 10 input pins and 3 output pins. The output pins are required for nondestructive manufacturing testing. The processor card 120a has a TMS320C31 processor chip which converts serial input data received from the I/O card 120g to parallel 32-bit words and manages the storage thereof by generating address words transmitted on the address bus 315. The processor card 120a is programmed to record the data with a maximum of two attempts per address and to employ data interleaving.

In order to electronically provide each memory card 120 a unique address without having to alter the memory card itself, the connector pads 180 in the cut-out region 175 are connected to address terminals of the EEPROM chips 100 by the hidden conductor paths within the circuit board 125. Shorting out a unique pattern of the connector pads 180 establishes a unique address of the particular memory card 120. (In one implementation, this pattern establishes the values of the first two most significant bits of the address of each memory location in every EEPROM chip 100 on the particular card.) For this purpose, the connector tunnels 187 in the peninsula 185 of each spacer 160 is unique to that spacer. Each connector tunnel 187 straddles a particular pair of connector pads 180. The pattern of straddled connector pads 185 is unique to each spacer 160. In this way, a unique memory address is provided for each memory card 120 to avoid ambiguity.

While the invention has been described in detail by specific reference to preferred embodiments it is understood that variations and modifications thereof may be made without departing from the true spirit and scope of the invention.

What is claimed is:

1. A high impact high memory capacity crash data recorder, comprising:
   (I.) a plurality of planar parallel circuit cards, each of said circuit cards comprising:
      (A) a circuit board;
      (B) plural integrated circuits mounted on said circuit board;
      (C) plural connector pads on a periphery of said circuit board connected through said circuit board to output terminals of integrated circuit memories;
      (D) a foam layer covering said plural integrated circuit memories and an adjacent portion of said circuit board, said periphery of said circuit board being uncovered by said foam layer;
   (II.) a plurality of planar parallel spacers, said spacers and said circuit cards being stacked in alternating sequence to form a card stack, each of said spacers comprising:
      (A.) a spacer body coextensive with said periphery of said circuit board and surrounding a void into which said foam layer nests;
      (B.) a lip surrounding annulus and surrounding a void above said annulus, said annular periphery of said circuit board nesting in said void above said spacer body;
      (C.) plural connector tunnels in registration with said plural connector pads and a button connector in each connector tunnel squeezed between connector pads of adjacent circuit boards; and
   (III.) a rigid housing surrounding said plural circuit cards and plural spacers.

2. The apparatus of claim 1 wherein said circuit board is disk-shaped, said periphery is a circular annulus, each spacer is a disk-shaped annulus, said housing is cylindrically-shaped and has an interior diameter no greater than the outside diameter of said lip.

3. The apparatus of claim 2 further comprising axial ribs extending outwardly from the exterior surface of said lip and abutting the interior surface of said housing.

4. The apparatus of claim 1 wherein said circuit board has two opposing planar surfaces, and wherein there are plural integrated circuit memories and connection pads on both of said planar surfaces and wherein there is a lip on both opposing faces of each spacer body.

5. The apparatus of claim 4 further comprising conductor paths inside said periphery connecting together connection pads on opposite sides of said periphery to provide a common bus connection for all of said circuit cards.

6. The apparatus of claim 4 wherein the bodies of spacers between successive circuit cards have a thickness substantially equal to half that of the circuit board of each circuit card, and wherein the lips of spacers between successive circuit cards have an axial thickness substantially equal to twice that of said foam layer on each side of each circuit card.

7. The apparatus of claim 6 further comprising a half spacer at each end of said card stack, each half spacer comprising a half spacer body coextensive with said periphery and surrounding a void into which the foam layer of an outer side of end one of said circuit cards nests, said half spacer body having a thickness equal to that of said foam layer.

8. The apparatus of claim 7 further comprising foam filled conical end caps having flat sides facing each of said half spacers.

9. The apparatus of claim 8 wherein said conical end caps have conical angles matching conical angles of said canister housing and said canister cover, respectively, said apparatus further comprising plural screws threaded into tapped holes in respective ends of said stand-off rods so as to fasten said conical end caps to a respective end of said card stack.

10. The apparatus of claim 9 further comprising isolation pads between said conical end caps and the adjacent interior surfaces of said canister housing.

11. The apparatus of claim 10 wherein said isolation pads comprises wadded tissue paper.

12. The apparatus of claim 1 further comprising plural stand-off clearance holes through said circuit cards and through said spacer, the clearance holes through said circuit cards being in registration with the clearance holes through said spacers, and rigid stand-off rods inserted through said clearance holes, each said rod passing through all of said circuit cards and spacers.

13. The apparatus of claim 1 wherein said spacers are integrally formed of foam.

14. The apparatus of claim 13 wherein said foam layer and said foam of said spacers comprises rigid polyurethane foam.

15. The apparatus of claim 1 wherein the plural integrated circuits mounted on an end one of said circuit cards in said stack comprises I/O circuitry, said apparatus further comprising:

a ribbon cable opening through said canister housing;

a ribbon cable connected to said end one of said circuit cards and extending through said ribbon cable opening through said canister housing.

16. The apparatus of claim 15 wherein the one circuit card at an opposite end of said stack has a processor integrated circuit thereon, said processor integrated circuit being programmed to control storage of data received via said ribbon cable to respective memory locations in other ones of said circuit cards.

17. The apparatus of claim 16 wherein the integrated circuits on said other ones of said circuit cards comprises EEPROM integrated circuits.

18. The apparatus of claim 1 wherein said button connectors comprise cylindrically bundled highly-conductive thin wire bundles.

19. The apparatus of claim 1 further comprising:

a cut-out region in said foam layer exposing a portion of said circuit board;

plural connection pads on the portion of said circuit board exposed by said cut-out region;

a peninsula extending radially inwardly from an inner circumference of said spacer body and being coextensive with said cut-out region, and having plural button connector tunnels therein in registration with a preselected pattern of said plural connection pads on said exposed portion of said circuit board, said pattern being unique in each different one of said spacers.

20. The apparatus of claim 19 wherein said pattern determines a unique electronic address for each one of said circuit cards and wherein said cut-out region provides rotational alignment between said spacers and said circuit cards.

* * * * *